(12) United States Patent
Ridgeway

(10) Patent No.: US 10,260,141 B2
(45) Date of Patent: Apr. 16, 2019

(54) METHOD OF FORMING A THERMAL BARRIER COATING WITH IMPROVED ADHESION

(71) Applicant: United Technologies Corporation, Hartford, CT (US)

(72) Inventor: Neil B. Ridgeway, South Windsor, CT (US)

(73) Assignee: United Technologies Corporation, Farmington, CT (US)

( * ) Notice: Subject to any disclaimer, the term of this patent is extended or adjusted under 35 U.S.C. 154(b) by 248 days.

(21) Appl. No.: 15/026,493

(22) PCT Filed: Sep. 25, 2014

(86) PCT No.: PCT/US2014/057361
§ 371 (c)(1),
(2) Date: Mar. 31, 2016

(87) PCT Pub. No.: WO2015/053947
PCT Pub. Date: Apr. 16, 2015

(65) Prior Publication Data
US 2016/0215382 A1 Jul. 28, 2016

Related U.S. Application Data

(60) Provisional application No. 61/888,886, filed on Oct. 9, 2013.

(51) Int. Cl.
C23C 16/40 (2006.01)
C23C 14/02 (2006.01)
(Continued)

(52) U.S. Cl.
CPC .............. *C23C 14/024* (2013.01); *C23C 4/08* (2013.01); *C23C 14/08* (2013.01); *C23C 14/16* (2013.01);
(Continued)

(58) Field of Classification Search
CPC .......... C23C 16/40; C23C 16/44; C23C 14/08
See application file for complete search history.

(56) References Cited

U.S. PATENT DOCUMENTS 6,177,200 B1 * 1/2001 Maloney ............... C23C 14/083
428/469
6,312,832 B1 11/2001 Alperine et al.
(Continued)

FOREIGN PATENT DOCUMENTS

EP 0926257 A1 6/1999
EP 0990716 A1 * 4/2000
(Continued)

OTHER PUBLICATIONS

Steenbakker, R., et al., "Erosion of Gadolinia Doped EB-PVD TBCs". Surface and Coatings Technology, vol. 201, Issue 6, Dec. 4, 2006, pp. 2140-2146.*
(Continued)

*Primary Examiner* — Bret P Chen
(74) *Attorney, Agent, or Firm* — Kinney & Lange, P.A.

(57) ABSTRACT

A method of forming a spallation resistant thermal barrier coating on a metal substrate includes cleaning the substrate and preheating the substrate to a temperature suitable for the deposition of a thermal barrier coating according to a preheating schedule that allows a thermally grown mixed oxide layer to form on the substrate. A ceramic thermal barrier coating deposited on the thermally grown mixed oxide layer forms a spallation resistant coating.

8 Claims, 2 Drawing Sheets

(51) Int. Cl.
  *C23C 14/08* (2006.01)
  *C23C 28/00* (2006.01)
  *C23C 4/08* (2016.01)
  *C23C 14/16* (2006.01)
  *C23C 14/24* (2006.01)
  *C23C 14/28* (2006.01)
  *C23C 14/34* (2006.01)

(52) U.S. Cl.
  CPC .............. *C23C 14/24* (2013.01); *C23C 14/28* (2013.01); *C23C 14/34* (2013.01); *C23C 28/321* (2013.01); *C23C 28/3215* (2013.01); *C23C 28/345* (2013.01); *C23C 28/3455* (2013.01)

(56) References Cited

U.S. PATENT DOCUMENTS

| | | | |
|---|---|---|---|
| 6,805,750 B1 | 10/2004 | Ristau et al. | |
| 6,878,215 B1* | 4/2005 | Zimmerman, Jr. | C23G 1/20 134/19 |
| 7,838,083 B1* | 11/2010 | Youchison | C23C 14/024 427/528 |
| 2002/0164430 A1 | 11/2002 | Heimberg et al. | |
| 2004/0043150 A1* | 3/2004 | Movchan | C23C 14/083 427/255.32 |
| 2004/0229031 A1* | 11/2004 | Gell | B82Y 30/00 428/323 |
| 2006/0240273 A1* | 10/2006 | Ogawa | C23C 4/02 428/632 |
| 2008/0199711 A1* | 8/2008 | Ishiwata | B32B 18/00 428/472 |
| 2011/0033284 A1 | 2/2011 | Tryon et al. | |
| 2012/0196030 A1 | 8/2012 | Neal et al. | |
| 2012/0308733 A1* | 12/2012 | von Niessen | C23C 4/02 427/454 |
| 2012/0328445 A1* | 12/2012 | Ridgeway | F01D 5/286 416/224 |
| 2013/0224432 A1* | 8/2013 | Hospach | C23C 4/127 428/119 |

FOREIGN PATENT DOCUMENTS

| | | |
|---|---|---|
| EP | 1591550 A1 | 11/2005 |
| EP | 1852521 A1 | 11/2007 |
| EP | 2036999 A1 * | 3/2009 |
| EP | 2365107 A1 | 9/2011 |

OTHER PUBLICATIONS

Bakan, Emine, et al., "Gadolinium Zirconate/YSZ Thermal Barrier Coatings: Plasma Spraying, Microstructure, and Thermal Cycling Behavior". J. Am. Ceram. Soc., 97[12] 4045-4051 (2014).*
Jiang, Chen, et al., "Double-Layer Gadolinium Zirconate/Yttria-Stabilized Zirconia Thermal Barrier Coatings Deposited by the Solution Precursor Plasma Spray Process". Journal of Thermal Spray Technology, vol. 24(6) Aug. 2015, pp. 895-906.*
Ito, Kaita, et al., "Detection of segmentation cracks in top coat of thermal barrier coatigs during plasma spraying by non-contact acoustic emission". Sci. Technol. Adv. Mater. 15 (2014) 035007 (11pp).*
"Introduction to Coating Design and Processing". ASM Handbook, vol. 5A, Thermal Spray Technology. R.C. Tucker, Jr, editor. 2013, pp. 1-13.*
International Search Report and Written Opinion dated Jan. 12, 2015, for corresponding PCT Application No. PCT/US2015/057361.
International Preliminary Report on Patentability dated Apr. 12, 2016, for corresponding PCT Application No. PCT/US2014/057361.
Extended European Search Report, for European Patent Application No. 14851774.1, dated May 8, 2017, 9 pages.
European Office Action, for European Patent Application No. 14851774.1, dated Jan. 31, 2018, 6 pages.

* cited by examiner

METHOD OF FORMING A THERMAL BARRIER COATING WITH IMPROVED ADHESION

BACKGROUND

The invention relates to thermal barrier coatings made from ceramic materials on metallic parts. In particular, the invention relates to a thermal procedure that improves the spallation resistance of a thermal barrier coating.

Metal components in the hottest section of modern gas turbine engines typically operate at temperatures that exceed their melting point. To circumvent this problem, the components are prevented from overheating by cooling air flowing through internal passageways in the components and by having external surfaces that are insulated with ceramic thermal barrier coatings. The addition of thermal barrier coatings reduces the amount of cooling air required and can substantially increase engine efficiency.

Common ceramic thermal barrier coatings are zirconias. Zirconias, in particular, yttria stabilized zirconia, containing 7 weight percent yttria, e.g., 7YSZ offer significant thermal protection and, in addition, are resistant to spallation, presumably due to the high fracture toughness of the material. The thermal conductivities of zirconia thermal barrier coatings, however, are not as satisfactory as gadolinia zirconia coatings. In particular, gadolinia zirconia coatings containing 59 weight percent $GdO_3$ and 41 weight percent $ZrO_2$ exhibit thermal conductivities that are about one half the thermal conductivity of zirconia coatings. Unfortunately, they can sometimes exhibit lower spallation resistance that limits their application.

Commonly owned U.S. Pat. No. 7,326,470 to Ulion et al. teaches that a 7YSZ layer between a GdZr thermal barrier coating and an underlying superalloy substrate can increase the spallation resistance of the coating but also increases weight and adds cost of an extra processing step.

SUMMARY

A metal article includes a metallic substrate and a spallation resistant ceramic coating, such as a thermal barrier coating. A thermally grown mixed oxide layer between the metal substrate and the thermal barrier coating enhances the spallation resistance of the coating. In an embodiment, the thermal barrier coating is about 51 weight percent gadolinia and about 49 weight percent yttria partially stabilized zirconia.

In another embodiment, a method of forming a spallation resistant thermal barrier coating on a metal substrate includes cleaning the substrate and preheating the substrate to a temperature suitable for the deposition of a thermal barrier coating according to a preheating schedule that allows a thermally grown mixed oxide layer to form on the substrate. A ceramic thermal barrier coating deposited on the thermally grown mixed oxide layer forms a spallation resistant coating.

DETAILED DESCRIPTION

Figure 1:
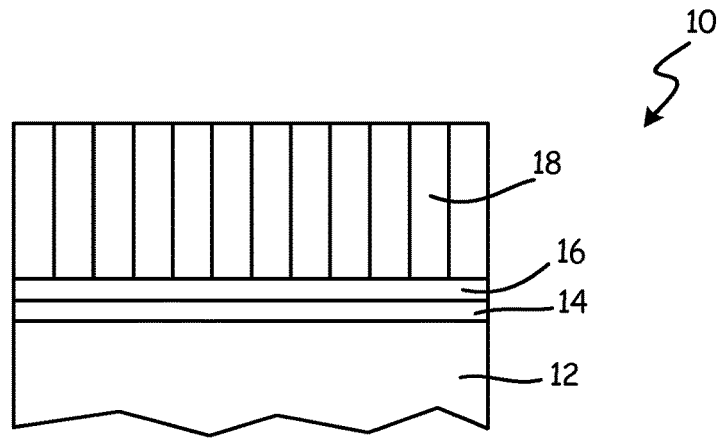
FIG. 1 is a schematic cross-section of a prior art yttria stabilized zirconia coating on a thermally grown oxide (TGO) layer.

A schematic cross-section of an yttria stabilized zirconia thermal barrier coating known in the art is shown in FIG. 1. Thermal barrier coating 10 is applied to a metal substrate 12. Metal substrate 12 may be a nickel base, cobalt base, iron base superalloy or mixtures thereof or a titanium alloy. Optional bond coat metal 14 is on substrate 12. Bond coat 14 may be a MCrAlY bond coat where M is Ni, Co or mixtures thereof or an aluminide which may include a platinum group metal. Alternatively, the substrate may comprise a material capable of forming an adherent alpha alumina layer and thus may not need a metallic bond coat. Layer 16 is an alpha alumina ($Al_2O_3$) thermally grown oxide (TGO) layer. TGO layer 16 may form during preheat to the deposition temperature. The TGO layer is required for successful adhesion of thermal barrier layer 18 to bond coat 14 or substrate 11. Thermal barrier layer 18 may be a zirconia layer, preferably yttria stabilized zirconia containing 7 weight percent yttria for enhanced fracture toughness (7YSZ).

A preferred means of forming 7YSZ layer 18 is by electron beam physical vapor deposition (EBPVD). As schematically indicated in FIG. 1, the vertical lines in layer 18 represent vertical grain boundaries or separations that enhance vertical microcrack formation during thermal cycling that increase the lateral compliance and minimize stress configurations leading to coating spallation. YSZ thermal barrier coating layer 18 may, alternatively, be applied by other thermal spray processes including but not limited to, air plasma spray (APS), low pressure plasma spray (LPPS), high velocity oxy fuel (HVOF), detonation gun (D Gun) and sputtering.

Commonly owned U.S. Pat. No. 4,321,311 to Strangman teaches the above-mentioned YSZ thermal barrier coat.

Figure 2:
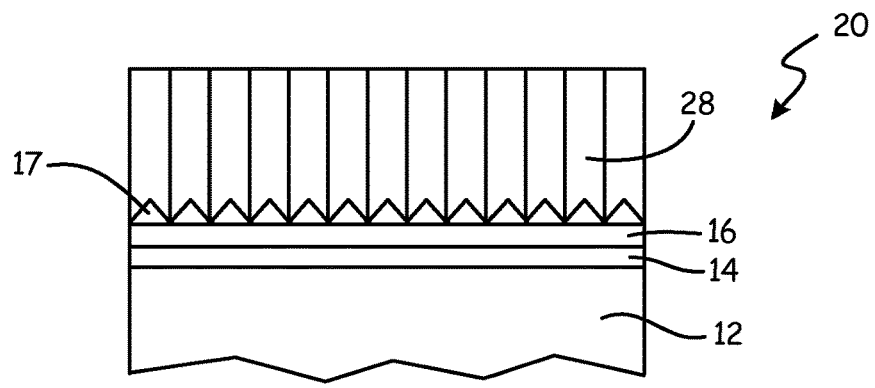
FIG. 2 is a schematic cross-section of a prior art gadolinia zirconia (GdZr) coating on a thermally grown oxide layer.

A lower thermal conductivity thermal barrier coating is gadolinia zirconia (GdZr), preferably about 51 weight percent gadolinia ($Gd_2O_3$) and about 49 weight percent zirconia ($ZrO_2$). A schematic of a GdZr thermal barrier coating is shown in FIG. 2. GdZr coating 20 comprises substrate 12, and optional bond coat 14 that have been described in reference to FIG. 1. Thermally grown oxide layer (TGO) 16 may be identical to layer 16 in FIG. 1 since the preheat schedule for GdZr layer 28 deposition is the same as the preheat schedule used for deposition of 7YSZ layer 18 in FIG. 1. GdZr layer 28 contains vertical grain boundaries and separations as schematically indicated by vertical lines that enhance vertical microcracking and suppress spallation during thermal cycling. As indicated by the irregular interface between GdZr layer 28 containing voids 17 (exaggerated for clarity) and standard thermally grown oxide (TGO) layer 16, GdZr may not adhere as well to a standard alpha alumina TGO layer. Alpha alumina as a bond coat is not compatible with a thermally insulative GdZr coating.

Figure 3:
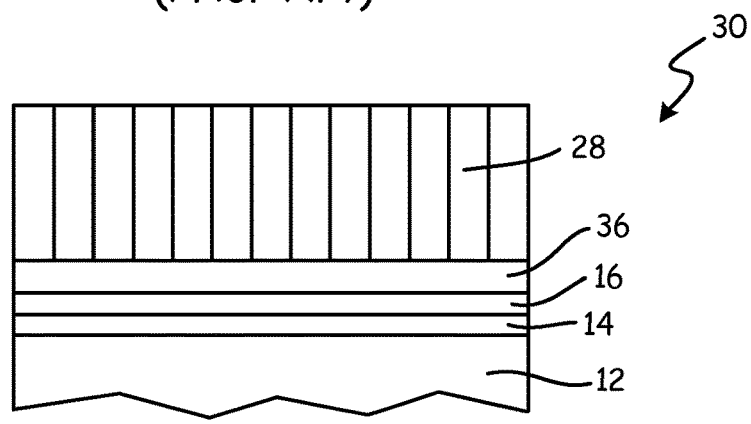
FIG. 3 is a schematic cross-section of a prior art GdZr coating on a TGO layer with a 7YSZ layer interspersed between a TGO layer and GdZr coating.

Improved adhesion of GdZr on a metallic bond coat or metallic substrate has been provided by interposing an yttria stabilized zirconia layer 36 between layer GdZr thermal barrier layer 28 and bond coat 16. This is taught in above-mentioned U.S. Pat. No. 7,326,470 to Ulion et al. and is schematically illustrated as thermal barrier coating 30 in FIG. 3. Thermal barrier coating 30 on substrate 12 comprises optional bond coat 14 as described earlier. Interposed layer 36 comprises an yttria stabilized zirconia layer (YSZ), preferably formed by EBPVD, on optional bond coat layer 16 oN substrate 14. The thickness of YSZ layer 36 is about 1 micron to about 2 mils. As noted, the addition of YSZ layer 36 between bond coat layer 16 and GdZr thermal barrier coat layer 28 adds weight and extra processing steps.

Figure 4:
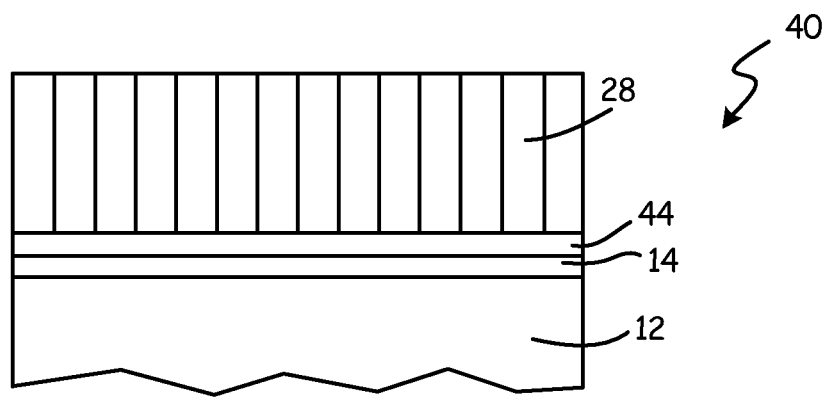
FIG. 4 is a schematic cross-section of a GdZr coating on a mixed oxide TGO layer of the invention.

The GdZr thermal barrier coating (TBC) of the invention on metal substrate 12 is shown in FIG. 4. TBC 40 comprises optional metal bond coat 14 as described earlier and GdZr layer 28. Thermally grown mixed oxide layer 44 is responsible for allowing GdZr thermal barrier layer 28 to exhibit increased adhesion during thermal cycling in service with reduced spalling. Coating 28 has the requisite vertical grain boundaries and separations and resulting vertical microcracks that relieve interfacial stresses by increasing the compliance of the coating thereby resisting spallation while providing required thermal protection.

The difference between the standard, thermally grown oxide layer 16 and thermally grown mixed oxide layer 44 of the invention lies in the differences in kinetics of formation of both layers. In the illustrated embodiment, the time to reach the preheat temperature for GdZr deposition was critical and was increased by three minutes.

The increased heat up time allowed a thermally grown oxide with a mixed oxide microstructure to form that resulted in acceptable adhesion of EBPVD GdZr coatings formed on the mixed oxide layer of the invention. Mechanisms describing the enhanced adhesion are speculative but suggest an increased interfacial compliance in the thermally grown mixed oxide layer during thermal cycling in operation. The composition of the TGMO layer presumably includes elements in addition to Al that diffuse out of the MCrAlY bond coat or, in the absence of a bond coat, the superalloy substrate, as a result of the extended heat up time that aid in the interfacial adhesion and compliances.

Figure 5:
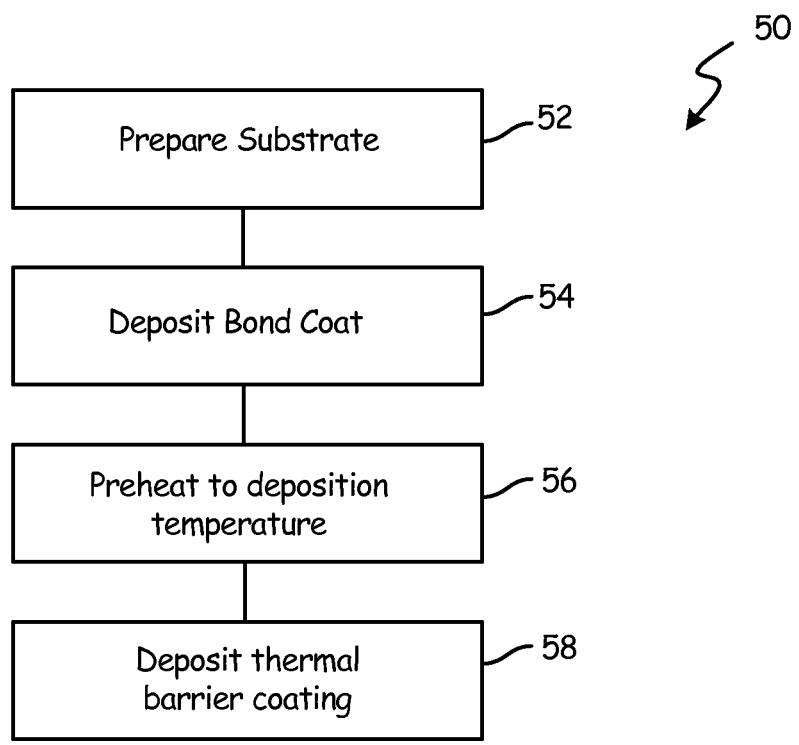
FIG. 5 is a method to form a GdZr coating of the invention.

Method 50 of forming the thermal bather coating of the invention is shown in FIG. 5. The first step is to clean and otherwise prepare the substrate surface. (Step 52). Conventional cleaning and preparation is by methods known to those in the art of thermal and high velocity coating deposition. Processes such as mechanical abrasion through vapor and air blast processes using dry or liquid carried abrasive particles impacting the surface are standard. Chemical methods such as acid and caustic surface removal at normal and elevated temperatures are also standard.

In the next step, an optional bond coat is deposited. (Step 54). Bond coats may be MCrAlY bond coats where M is Ni, Co or mixtures thereof or an aluminide which may also include one or more precious metals.

The next step is to preheat the substrate to a deposition temperature in order to form thermally grown mixed oxide layer 44. (Step 56). In an embodiment, the deposition temperature may be between 1875° F. and about 1920° F. and the heat up time may be between about 15 minutes and 18 minutes. A final step is to deposit a GdZr thermal barrier layer. (Step 58). Deposition may be by thermal spray processes such as air plasma spray (APS), low pressure plasma spray (LPPS), high velocity oxy fuel (HVOF), detonation gun (D-Gun), sputtering, electron beam physical vapor deposition (EBPVD) and others known in the art. EBPVD is preferred due to the vertical grain boundary/microcrack microstructure resulting from this form of coating.

Discussion of Possible Embodiments

The following are non-exclusive descriptions of possible embodiments of the present invention.

A metal article includes: a metal substrate; a thermal barrier coating (TBC); and a thermally grown mixed oxide (TGMO) layer between the metallic substrate and the TBC.

The metal article of the preceding paragraph can optionally include, additionally and/or alternatively any, one or more of the following features, configurations and/or additional components:

The TBC may be gadolinia zirconia GdZr.

The TBC may be about 59 weight percent gadolinia and the remainder substantially zirconia.

The thermal barrier coating may be applied by thermal spraying, sputtering, or electron beam physical vapor deposition (EBPVD).

The thermal barrier coating may be deposited by EBPVD.

The substrate may be a nickel-based, cobalt-based, or iron-based superalloy or mixtures thereof or a titanium alloy.

The thermally grown mixed oxide layer may be formed during the preheat process while the substrate is heated to the thermal barrier coat deposition temperature.

The preheat process comprises a heat up time of about 15 minutes to about 18 minutes to a thermal barrier coating deposition temperature of between about 1875° F. and about 1925° F.

The thermal barrier coating thickness may be between about 1 mil and about 15 mils.

The thermally grown mixed oxide layer may have a thickness of between about 0.1 micron and about 1.0 micron.

A method for forming a spallation resistant thermal barrier coating on a metal substrate may comprise: cleaning the substrate; preheating the substrate to a temperature suitable for the deposition of a thermal barrier coating according to a preheating schedule that allows a thermally grown mixed oxide layer to form on the substrate; and depositing the thermal barrier coating on the thermally grown mixed oxide layer.

The method of the preceding paragraph can optionally include, additionally and/or alternatively any, one or more of the following features, configurations and/or additional components:

The metal substrate may comprise a nickel-based, cobalt-based, iron-based superalloy or mixtures thereof or a titanium alloy.

The thermal barrier coating may be gadolinia zirconia.

The gadolinia zirconia TBC may comprise about 59 weight percent gadolinia and the remainder substantially zirconia.

The thermal barrier coating may be deposited by thermal spray, sputtering or electron beam physical vapor deposition (EBPVD).

The thermal barrier coating may be deposited by EBPVD.

The thermal bather coating may be between about 1875° F. and about 1925° F.

The preheating schedule may comprise a heating time of about 15 minutes to about 18 minutes to the thermal barrier coating deposition temperature.

The thermal barrier coating thickness may be from about 1 mil to about 15 mils.

The thermally grown mixed oxide layer thickness may be from about 0.1 micron to about 1.0 micron.

Although the present invention has been described with reference to preferred embodiments, workers skilled in the art will recognize that changes may be made in form and detail without departing from the spirit and scope of the invention.

The invention claimed is:

1. A method of forming a spallation resistant thermal barrier coating on a metal substrate comprising:
   cleaning the substrate;
   preheating the substrate to a temperature suitable for the deposition of a thermal barrier coating according to a preheating schedule that allows a thermally grown mixed oxide layer to form on the substrate; and
   depositing the thermal barrier coat on the thermally grown mixed oxide layer:
   wherein the thermal barrier coat deposition temperature is between about 1875° F. and about 1925° F.; and
   wherein the preheating schedule comprises a heating time of about 15 minutes to 18 minutes to the thermal barrier coat deposition temperature.

2. The method of claim 1 wherein the metal substrate comprises a nickel base, cobalt base, iron base superalloy or mixtures thereof or a titanium alloy.

3. The method of claim 1 wherein the thermal barrier coating is gadolinia zirconia.

4. The method of claim 3 wherein the gadolinia zirconia TBC comprises about 59 weight percent gadolinia and the remainder substantially zirconia.

5. The method of claim 1 wherein the thermal barrier coating is deposited by thermal spray, sputtering or electron beam physical vapor deposition.

6. The method of claim 5 wherein the thermal barrier coating is deposited by EBPVD.

7. The method of claim 1 wherein the thermal barrier coating thickness is from about 1 mils and about 15 mils.

8. The method of claim 1 wherein the thermally grown mixed oxide layer thickness is from about 0.1 micron and about 1.0 micron.

* * * * *